United States Patent [19]

Amidieu et al.

[11] Patent Number: 5,263,538
[45] Date of Patent: Nov. 23, 1993

[54] EQUIPMENT SUPPORT, FIXING AND HEAT CONDITIONING PANEL

[75] Inventors: Marcel Amidieu, Cannes-la-Bocca; Jean-Loup Foret, Nice, both of France

[73] Assignee: Aerospatiale Societe Nationale Industrielle, France

[21] Appl. No.: 955,656

[22] Filed: Oct. 2, 1992

[30] Foreign Application Priority Data

Oct. 18, 1991 [FR] France ................ 91 12926

[51] Int. Cl.⁵ .............................................. F28F 3/12
[52] U.S. Cl. ........................... 165/168; 165/170; 165/171
[58] Field of Search ............. 165/168, 170, 171

[56] References Cited

U.S. PATENT DOCUMENTS

| 2,512,875 | 6/1950 | Reynolds | 165/168 X |
|---|---|---|---|
| 3,298,433 | 1/1967 | Lemelson | 165/168 |
| 3,621,671 | 11/1971 | Ullrich | 165/170 X |
| 4,306,616 | 12/1981 | Woods, Jr. et al. | 165/136 |
| 4,476,856 | 10/1984 | Cacarda | 165 X/170 X |
| 4,884,168 | 11/1989 | August et al. | 361/382 |

FOREIGN PATENT DOCUMENTS

| 0014249 | 8/1980 | European Pat. Off. . | |
|---|---|---|---|
| 0027845 | 6/1982 | European Pat. Off. . | |
| 0197817 | 10/1986 | European Pat. Off. . | |
| 760134 | 2/1934 | France | 165/170 |
| 2538989 | 7/1984 | France . | |
| 223394 | 9/1942 | Switzerland | 165/165 |
| 826625 | 1/1960 | United Kingdom | 165/170 |

Primary Examiner—Allen J. Flanigan
Attorney, Agent, or Firm—Remy J. VanOphem

[57] ABSTRACT

A panel embodying a honeycomb layer between two plates and a fluid circulation network with tubes in contact internally with one plate and fluid inlet and outlet manifolds. Grooves are formed in the honeycomb layer to accommodate the tubes. On the panel is provided an array of fixing locations, all of which are disposed between the tubes and some at least of which are occupied by inserts. The panel can be used for heat conditioning, supporting and fixing an electrical, electronic or other equipment, for example in cabinets on board vehicles, aircraft or spacecraft.

17 Claims, 5 Drawing Sheets

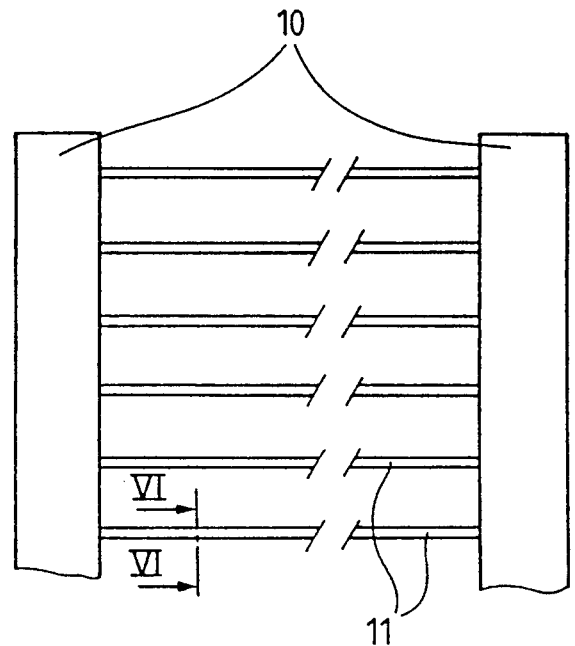
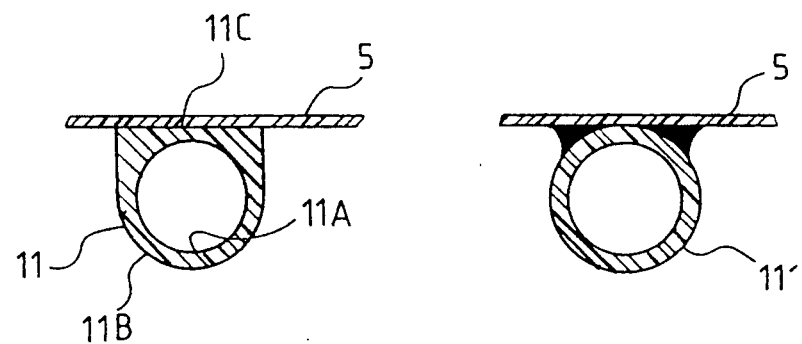
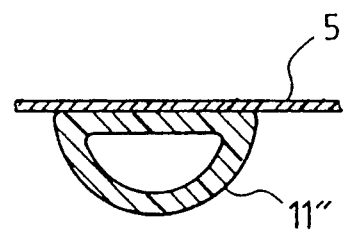

EQUIPMENT SUPPORT, FIXING AND HEAT CONDITIONING PANEL

BACKGROUND OF THE INVENTION

1. Field of the Invention

The invention concerns a panel through which a heating or cooling fluid circulates for heat conditioning an electrical, electronic or other item of equipment which is also mechanically mounted by means of the panel.

The invention is more particularly, although not exclusively, directed to panels which are part of cabinets or racks on board vehicles, aircraft and spacecraft and containing various electronic equipment units within a confined space. In practice the heat conditioning of such equipment consists in powered cooling to eliminate the considerable heat generated by the operation of electronic equipment in a confined space.

The mechanical mounting of the equipment involves immobilizing it at given locations in order to avoid any risk of damage through impact during maneuvers of the aircraft or spacecraft on board which it is installed. Given the aerospace context, these thermal and mechanical functions must be achieved with minimal mass.

More generally the invention is directed to all fields in which it is necessary to immobilize equipment mechanically and to heat condition it (by cooling or heating it) within a confined space and with minimal additional mass.

2. Description of the Prior Art

French Patent No. 2,294,417 discloses a support and heat exchange panel through which fluid circulates internally. It includes two stacked metal plates between which there is a constant spacing and which are joined together in a fluid-tight manner along their periphery, so delimiting a hermetically sealed space. The panel has a plurality of internal baffles perpendicular to the plates holding them apart and dividing the aforementioned space into a set of juxtaposed channels connected alternately in series at their ends to form a labyrinth. Fluid inlet and outlet means are provided at the ends of the set of juxtaposed channels. Panels of this kind can be used as cooling or heating equipment shelves, in particular in deep-freezing, sublimation or freeze-drying equipment operating in a vacuum.

One such type of panel has the drawback of being complex to manufacture (numerous components to be assembled blind) and heavy (a considerable fraction of its volume is metal, in the examples considered here stainless steel).

A panel of this kind also raises problems of sealing since it is the panel as a whole which constitutes the space within which the channels are defined, which rules out very high fluid pressures and, therefore, transfer of large quantities of heat. A further consequence of this structure is that in practice it rules out the use of screws to fix any unit because it is virtually impossible to drill holes without compromising the seal and this is neither described nor suggested in this prior art patent. A panel of this kind must, therefore, be restricted to simple terrestrial support applications.

The same kinds of drawbacks apply to French Patent 2,083,700 which discloses a sealed heating panel formed of two plates welded together along their edges and then deformed. Also, there is no particular mechanical requirement stated, only a thermal function being discussed.

U.S. Pat. No. 3,490,523 and French Patent 2,647,198 describe heat exchangers using fluids; the exchanger panels disclosed in these references have no support function.

U.S. Pat. No. 4,998,181 concerns both the cooling and the mechanical support of electronic components but its teaching is restricted to components of small size because the mechanical support consists in confinement in an enclosure. The components are in practice distributed within tubes in turn confined within the enclosure. This patent is, therefore, of highly specific application.

European Patent 302,641 concerns the cooling of small size electronic microchips. Cooling is provided by a cooling plate disposed over an array of microchips, with given specifications, the plate including a heat exchanger peg or piston above each microchip. Apart from its complexity, the cooling plate has no mechanical function because it and the microchips are supported by a substrate.

Finally, in the space field, thin radiators carried by panels are known. Reference may be had to:

"A new Generation of Radiators"—AMIDIEU, BERTHON, MACIAZSEK—20th International Conference on Environmental Systems—Jul. 9–12, 1990, Williamsburg, Va.; or "Radiator Conceptual Studies for the HERMES Spaceplane—AMIDIEU, FORET, SIBILO—3rd European Symposium STC & LSS, ESA/ESTEC, 3–6 Oct. 1988; or "Development of Heat Exchangers for Hybrid Radiators"—AMIDIEU, LAFON—same conference as above.

These radiators embody two parallel manifolds joined together by a large number of parallel tubes running along a radiating surface to which they are fixed. In practice the manifolds are extruded. The radiators are either attached or integrated into an exterior wall designed to be exposed to vacuum: because of the radiating surface, these radiators reject heat into the vacuum of space. Also disclosed is a radiator with heat pipes and condensers, the heat pipes exchanging heat with the condensers and with the radiating surface being disposed between the condensers and the radiating plate.

However, these radiators have no equipment mechanical support or securing function.

An object of the invention is to solve the following technical problem, which is not addressed by the aforementioned documents: to enable the supporting and the fixing of equipment (in particular electronic modules) of any shape and the heat conditioning thereof by means of low-mass panels adapted to be incorporated in racks or cabinets and having very good mechanical strength and a high heat transfer capacity.

SUMMARY OF THE INVENTION

The present invention is a panel for heat conditioning, supporting and fixing an equipment in a confined space which has a first plate adapted to come into contact with the equipment to exchange heat therewith. A second plate is provided parallel to the first plate, with a heating or cooling fluid circulation network between the plates which embodies a plurality of parallel similar tubes. The tubes are in contact with the interior side of the first plate and are connected at their ends to two parallel transverse manifolds with respective fluid inlet and outlet connectors and extending along two edges of the panel. A honeycomb layer with cells perpendicular to the plates extending from one manifold to the other and from one plate to the other is also provided. The honeycomb layer has grooves to accommodate the tubes and a plurality of fixing locations disposed in an array between the tubes, at least some of which are occupied by inserts extending through at least part of the thickness of the panel and which are adapted to receive the fixing members.

It will be understood that the invention proposes a low mass structure whose thermal function (manifolds plus tubes) and whose mechanical stiffness function (baseplate and honeycomb layer) are provided by different means. This enables mechanical fixing of equipment using a large number of fixing locations between the tubes and, therefore, independent of the thermal function.

In this respect the invention is clearly distinguished from the simple shelves disclosed by French Patent 2,294,417 whose thermal functions (circulation of fluid) and mechanical strength (the walls delimiting the fluid circulation channels) are closely interrelated.

Furthermore, the use of tubes provides better resistance to internal pressure than most of the prior art mentioned above: typically 5 to 10 bars, while the presence of the honeycomb layer guarantees very good resistance to external pressure.

The independence of the thermal and mechanical functions also enables the manifolds and the tubes to be fastened together by welding before they are integrated into the panels, which provides a better seal and facilitates the construction of the panel.

With respect to the radiators analyzed above and to which the panel of the invention may seem to be similar, it should be noted that it was not at all obvious to one skilled in the art to draw inspiration from them for an electronic and electrical equipment cabinet panel. First of all these radiators were intended to be used outside the vehicle, the tubes running along a radiating surface with no mechanical support or fixing function, these radiators themselves being in principle carried by a support mechanical structure. Furthermore, the heat to be evacuated was much lower than the heat generated in a confined space by numerous items of electronic equipment included in the flight system of an aircraft or spacecraft, for example, and it was by no means obvious that it would be possible to obtain the heat extraction capacity required of an electronic cabinet panel without having to move the tubes close together or to choose diameters thereof that would make it possible to interleave screw fixing inserts at numerous locations between the tubes. Note in this connection that the phenomena of heat exchange are different in radiators towards the exterior (radiation) and in electrical/electronic equipment cabinet panels (conduction between the equipment and the tubes, which depends strongly on the equipment itself: flatness of its contact surface, number of fixing screws, fixing method (screws in through holes or blind holes), materials employed, grounding, etc.).

According to preferred features of the invention that are optionally combinable, the manifolds each have two flats in contact with respective plate edges.

The manifolds are of milestone shape with a cylindrical inside surface and connectors for connection to the tubes.

The fluid inlet and outlet connectors are at the ends of the manifolds.

The fluid inlet and outlet connectors are at the ends of the manifolds at adjacent corners of the panel.

The tubes have a cylindrical inside surface and an exterior surface having a flat in contact with the first plate.

The tubes are milestone shape.

The tubes are cylindrical and are of constant thickness.

The tubes are semi-cylindrical and of constant thickness.

The array of fixing locations constitutes lines parallel to the tubes.

The flow cross section of the tubes is between 1 and 20% of the flow cross section of the manifolds.

The spacing between the tubes is between 1 and 25 cm.

The fluid circulation network is adapted to withstand high working pressures of at least 5 bars.

The fluid circulation network, the plates, and the inserts provided at some at least of the fixing locations are made from aluminum alloy.

The fluid circulation network is made from stainless steel and the plates and the inserts are made from aluminum alloy.

Stiffeners run externally along portions of the plates between which the manifolds are disposed.

Objects, features and advantages of the invention will emerge from the following description given by way of non-limiting illustrative example with reference to the appended drawings.

BRIEF DESCRIPTION OF THE DRAWINGS

FIG. 5 is a top view of the tube assembly of the panel shown separately;

FIG. 6A is a view of a tube of the panel in contact with the support surface in cross section taken on line VI—VI in FIG. 5;

FIGS. 6B and 6C are alternate embodiments of that depicted in FIG. 6A;

DETAILED DESCRIPTION OF THE PREFERRED EMBODIMENT

Figure 1:
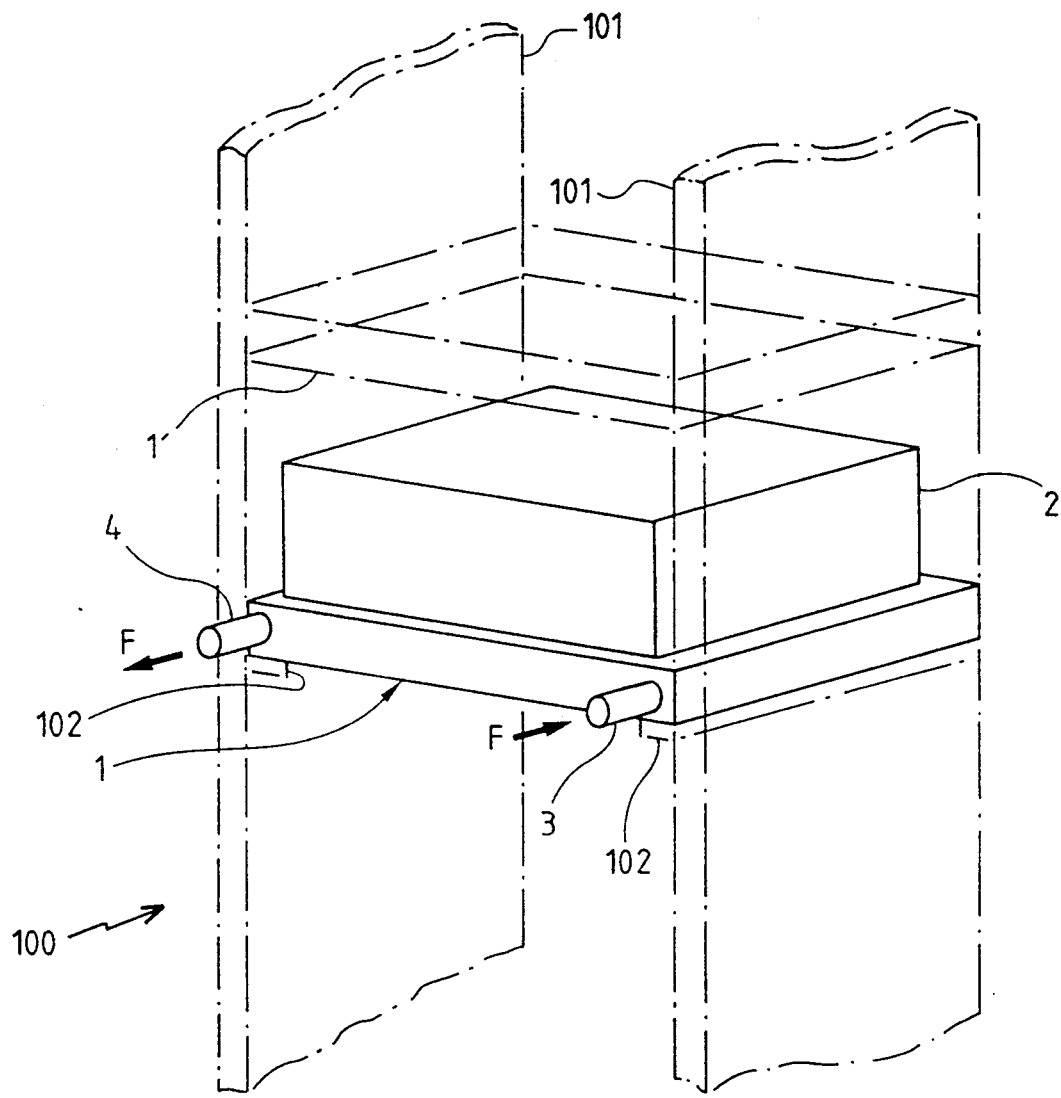
FIG. 1 is a perspective view of a cabinet panel in accordance with the invention to which an equipment is fixed.

FIG. 1 shows a panel 1 in accordance with the invention forming part of a cabinet or rack 100 shown in chain-dotted outline and carrying an electronic equipment module 2, in this instance in the form of a parallelepiped-shape module (this is an entirely conventional shape for electronic equipment).

The cabinet has at least two vertical panels 101 and a plurality of similar horizontal panels of which only two panels 1 and 1' are shown.

The vertical panels are of any appropriate known type and may incorporate a heating or cooling fluid circuit. Because they are not of themselves any part of the invention these panels will not be further described here. Suffice to say that they are provided on at least one side (or both) with angle-irons 102 or simple lugs to receive the horizontal panels 1. Note that the module 2 is in a very restricted space between the panels 101, 1 and 1'.

Each panel 1 or 1' provides an exchange of heat between a heating or cooling fluid which circulates in it, as indicated by the arrows F near fluid inlet and outlets 3 and 4, respectively, and the equipment carried by the panel; it further supports and immobilizes the equipment.

The panel 1 is shown in more detail in FIGS. 2 through 5, 6A and 7.

The panel 1 is provided with a fluid circulation network 7 between upper and lower plates 5 and 6 and a honeycomb layer 8 with cells extending transversely to the plates.

Figure 2:
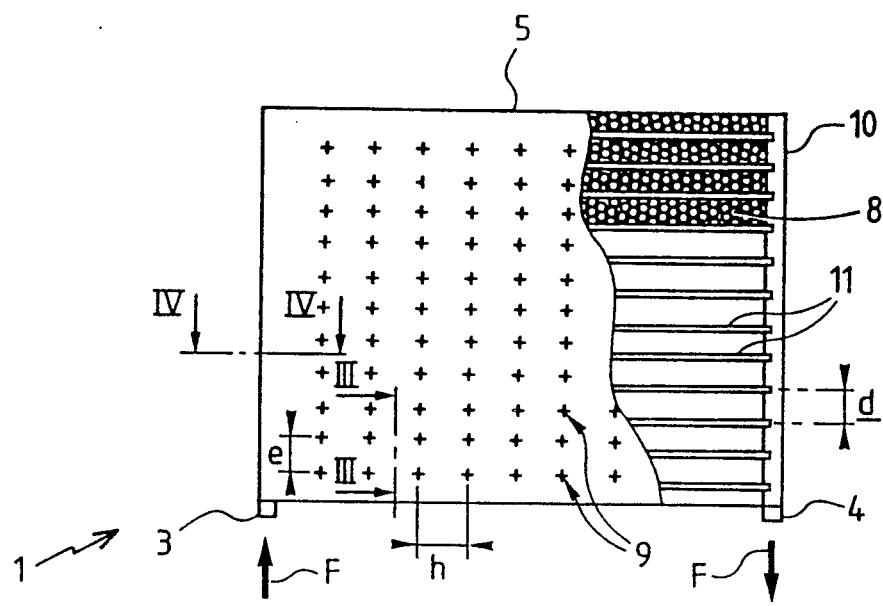
FIG. 2 is a partially cut away top view of the panel of FIG. 1.
Figure 3:
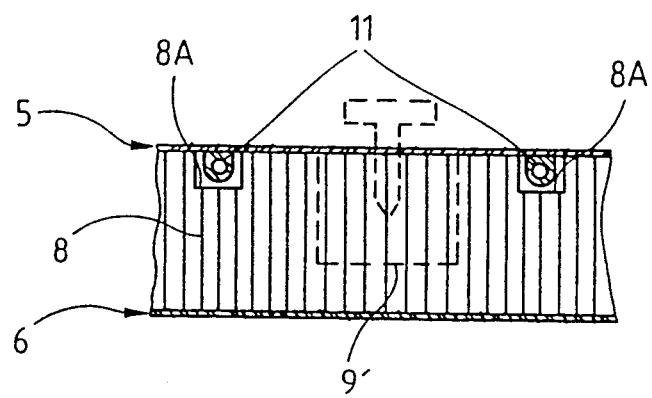
FIG. 3 is a partial view of the panel in cross section taken on line III—III in FIG. 2.

FIG. 2 shows an array of crosses 9, each representing a fixing location, that is to say a location at which conventional fixing screws (not shown) can be provided, as required, in through holes or blind holes. In the example shown in FIGS. 2 through 4 most of the locations 9 are potential in the sense they are marked but not made. However, metal inserts of any appropriate known type are incorporated into the panel at some of these locations. FIG. 3 shows the outline 9' of an insert receiving a screw in a blind hole. The fitting of inserts into a sandwich structure incorporating a honeycomb layer is known in itself and will not be described in detail here. In an alternative embodiment (not shown) inserts like the insert 9' may be incorporated from the outset in a predetermined array utilizing some or all of the fixing locations.

The fluid circulation network 7 through which the fluid circulates is integral with the panel.

Referring to FIG. 5, the fluid circulation network 7 is made up of a set of parallel tubes 11 welded at their ends to manifolds 10 provided with the inlet and outlet connectors 3 and 4. The fluid enters through one manifold, is divided uniformly between the tubes 11, reaches the second manifold and then exits through the outlet connector 4. The fluid circulation network 7 is connected to any appropriate known type fluid circuit (not shown).

In the example shown, the inlet and outlet connectors 3 and 4 are provided on the same side of the panel, at adjacent corners. It is clear, however, that they could be provided at opposite corners of the panel or at any point on the manifolds rather than at one end thereof.

The heat conditioning fluid is water, for example, at a nominal pressure of 5 bars, a higher pressure (up to 20 bars, for example, or more) having the particular advantage of preventing unwanted physical phenomena in the fluid such as cavitation in the event of sudden acceleration and of being able to withstand the acceleration loads typical of aerospace applications.

FIG. 6A shows the cross section of the tubes 11. The tubes have a cylindrical inside surface 11A whereas their outside surface 11B, of inverted milestone shape, incorporates a flat 11C constituting a surface of contact with the upper plate 5. In principle the tubes are adhesively bonded by means of these flats and over their entire length to the upper plate; this adhesive bonding is easily effected using any appropriate known heat conducting adhesive.

FIGS. 6B and 6C show alternate implementations of the tubes. FIG. 6B shows a cylindrical tube 11' with no flat fixed to the upper plate by two beads of adhesive. FIG. 6C shows a tube 11' of semi-circular cross section enabling effective and easily effected adhesive bonding, as in FIG. 6A, but with a higher mass per unit length of the tubes 11'' than of the tubes 11.

Figure 4:
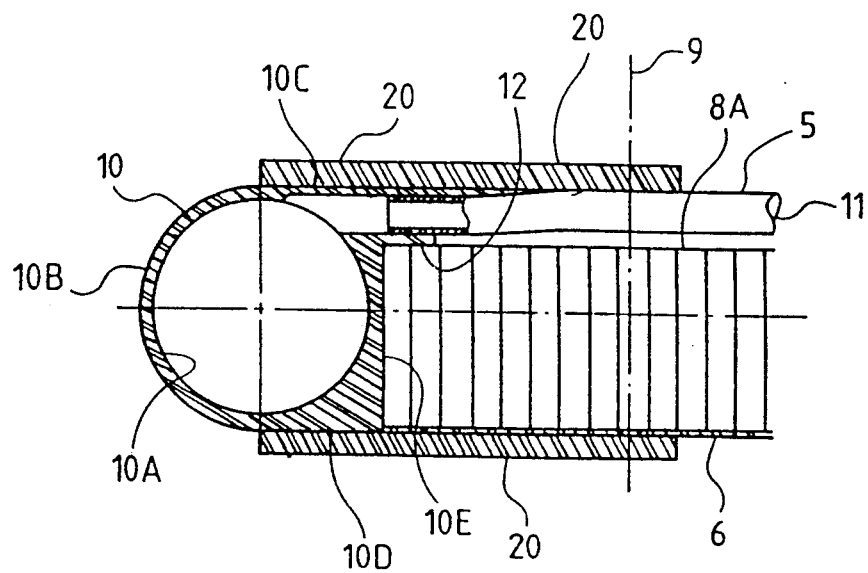
FIG. 4 is another partial view of the panel in cross section taken on line IV—IV in FIG. 2.

Referring to FIG. 4, the tubes 11 are connected, in practice welded, to transverse connectors 12 provided on the manifolds 10.

As shown in FIG. 4, and like the tubes 11, the manifolds 10 have a cylindrical inside surface 10A and a milestone-shaped outside surface 10B but this "milestone" shape is on its side and so forms two parallel flats 10C and 10D adapted to lie against the plates 5 and 6 for which they, therefore, constitute spacers in this example.

Figure 7:
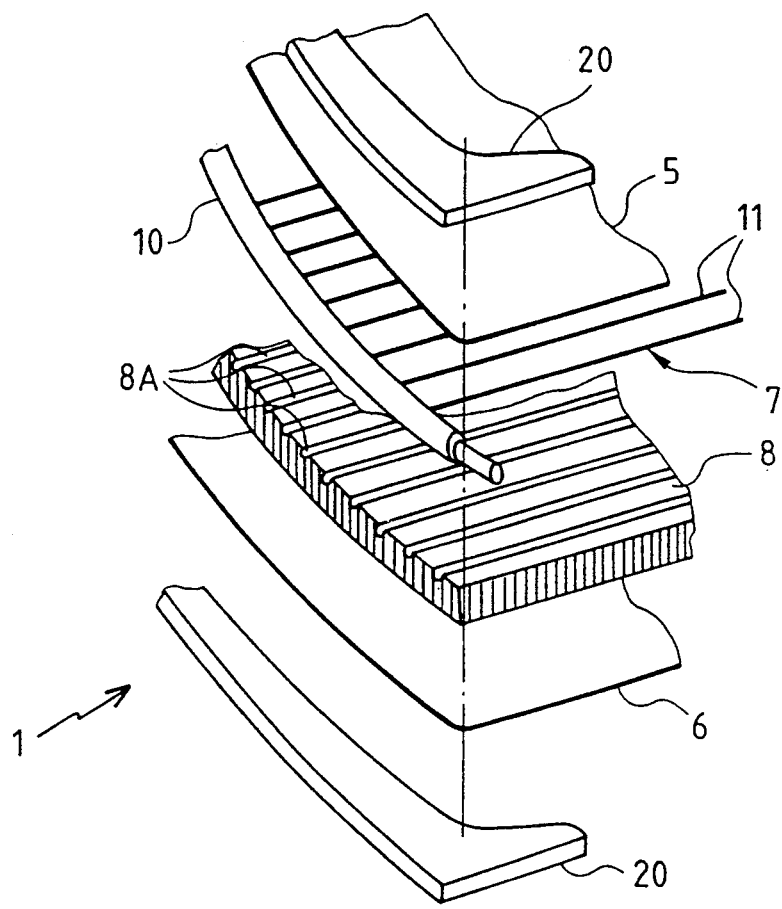
FIG. 7 is a partial exploded view of the panel from FIG. 2.

FIG. 4 shows clearly that the manifolds 10 constitute the edges of the panel 1. FIGS. 4 and 7 show that the panel may incorporate external stiffeners 20 along these edges.

All of the volume delimited by the upper and lower plates 5 and 6 and by the manifolds is occupied by the honeycomb layer 8. Because they are the shape of milestones on their side the manifolds have a third flat 10E parallel to the cells of the honeycomb layer 8.

FIGS. 3 and 7 show parallel grooves 8A adapted to accommodate the tubes 11 formed in the honeycomb layer 8.

The layer, therefore, extends from one manifold 10 to the other and from one plate 5 or 6 to the other.

Because of this structure the panel 1 combines great stiffness with low mass.

The fixing locations and, therefore, the inserts 9' are all disposed between the tubes 11, that is to say at locations where the panel 1 is equivalent to a conventional sandwich panel.

The spacing h between the fixing locations 9 in the direction parallel to the tubes can have any value. Transversely to the tubes, however, the distance e between the locations is equal to the distance d between the tubes or an integer multiple of this distance.

The large number of locations 9 guarantees that it is possible to fix to the panel 1 a very great variety of equipments 2, possibly after fitting the necessary inserts if these are not fitted as standard.

It has already been mentioned that the equipment is fixed by means of screws. The screws may be received in blind holes (see FIG. 3) in which case they cooperate with a threaded bore in the associated insert 9'; they can instead be inserted in through holes in which case they may cooperate with nuts after passing through plain bores in the inserts.

The predefined array of locations 9 and the large number of potential fixing points for a given equipment ensures that good contact can be achieved between the equipment and the panel. If necessary, the contact between the panel and the equipment can be improved by inserting the thinnest possible interface product which may be in sheet form ("CHOTERM", SIGRAFLEX", indium, for example) or in glue form.

The exchange of heat between the fluid circulating in the fluid circulation network 7 and the equipment (or vice versa) is effected by convection between the fluid and the tubes, by conduction through the tubes, by contact between the tubes and the upper plate and by contact between the upper plate and the equipment.

The plate to which the tubes are glued provides a heat distributor.

To give one specific example of implementation of the panel 1, the plates 5 and 6, the manifolds 10, the tubes 11 and the inserts are made from aluminum alloy (tubes in AlMg Si 0.5 alloy and inserts and plates in AU4G1 alloy, for example); connections between manifolds and tubes are welded and all other connections are glued with REDUX-CIBA BSL 312 VL DE glue. The honeycomb layer 8 is of the type marketed by Aerospatiale under the trade name "NIDA" with a cell size of $6 \times 20$ P (mesh diameter 6 mm, wall thickness 20 μm). The tubes and manifolds are extruded. In applications where greater masses are acceptable stainless steel may be substituted for the aforementioned aluminum alloy, especially when it is required to use heating or cooling fluids that are not compatible with aluminum alloys.

The panel is 750 mm long, for example, 550 mm wide (this is the length of the manifolds 10), 25 mm thick and has a $45 \times 70$ mm array of fixing locations for a tube spacing of 45 mm; the tubes have an inside diameter of 3 mm and a thickness of 0.5 mm and the manifolds have an inside diameter of 22 mm and a thickness of 1.5 mm.

Figure 8:
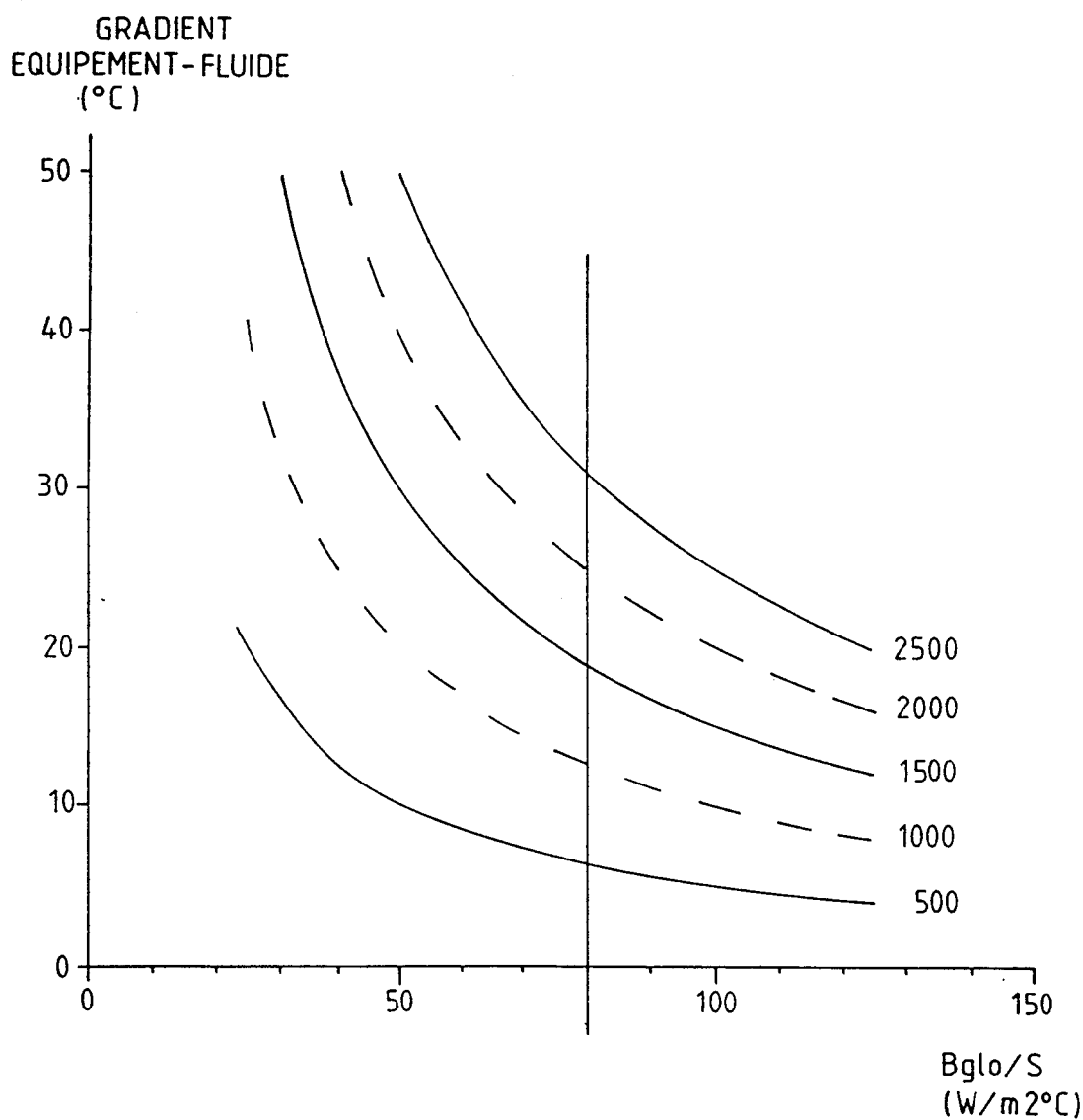
FIG. 8 is a graph plotting the heat gradient between equipment and fluid (in °C.) against the global conductance between fluid and equipment (in $W/m^2.°C.$).

FIG. 8 illustrates the performance of the panel: temperature gradient as a function of the global conductance of the system per unit surface area for various heat transfer rates. First tests have shown that the aforementioned panel guarantees a global conductance of at least 80 W/m²/°C. The fluid used was water and the interface between the equipment and the panel was a plate of CHOTERM 1671, manufactured by the company Chomerics.

The same panel was used with a low-boiling point coolant liquid ("FREON") at a pressure of 20 bars.

It goes without saying that the foregoing description has been given by way of non-limiting example and that numerous variants may be put forward without departing from the scope of the invention.

For example, the equipment may additionally be fixed under such panels, in which case additional tubes are further provided along the lower surface or the panel is simply inverted. Also, the panels are not necessarily flat. Finally, stainless steel may be used, in particular for the fluid circulation network.

We claim:

1. A panel for heat conditioning, supporting and securing equipment in a confined space, said panel comprising:
a first plate on which said equipment is supported so as to be in thermal communication with said first plate;
a second plate substantially parallel to and spaced apart from said first plate;
a fluid circulation network disposed between said first and second plates, said fluid circulation network comprising:
a plurality of passage means in contact with said first plate so as to be in thermal communication with said first plate; and
manifold means in fluidic communication with said plurality of passage means, said manifold means having a fluid inlet and a fluid outlet;
means disposed between said first and second plates for providing structural stiffness to said panel, said stiffening means having a surface with grooves formed therein for receiving said plurality of passage means; and
a plurality of fixing locations on said first plate for securing said equipment to said panel.

2. A panel according to claim 1 wherein said manifold means comprises two manifolds, each of said two manifolds having two flats in contacts with said first and second plates.

3. A panel according to claim 2 wherein each of said two manifolds has a milestone shape with a cylindrical inside surface and has means for securing said plurality of passage means thereto.

4. A panel according to claim 1 wherein said fluid inlet and said fluid outlet are oppositely disposed on said manifold means.

5. A panel according to claim 4 wherein said fluid inlet and said fluid outlet are adjacent corners of said panel.

6. A panel according to claim 1 wherein said plurality of passage means is a plurality of tubes, each of said plurality of tubes having a cylindrical inside surface and an exterior surface having a flat in contact with said first plate.

7. A panel according to claim 6 wherein each of said plurality of tubes is milestone shape.

8. A panel according to claim 1 wherein each of said plurality of passage means is substantially cylindrical and has a substantially constant thickness.

9. A panel according to claim 1 wherein each of said plurality of passage means is substantially semi-cylindrical and has a substantially constant thickness.

10. A panel according to claim 1 wherein said plurality of fixing locations define rows which are substantially parallel to said plurality of passage means.

11. A panel according to claim 1 wherein the flow cross section of each of said plurality of passage means is between about 1 and about 20% of the flow cross section of said manifold means.

12. A panel according to claim 1 wherein each adjacent pair of said plurality of passage means is spaced apart about 1 to about 25 cm.

13. A panel according to claim 1 wherein said fluid circulation network is able to withstand high working pressures of at least 5 bars.

14. A panel according to claim 1 wherein said fluid circulation network and said first and second plates are made from in aluminum alloy.

15. A panel according to claim 1 wherein said fluid circulation network is made from stainless steel and said first and second plates are made from an aluminum alloy.

16. A panel according to claim 1 further comprising external stiffening means disposed along portions of said first and second plates between which said manifold means is disposed.

17. A panel for heat conditioning, supporting and securing equipment in a confined space, said panel comprising:
a first plate on which said equipment is supported so as to be in thermal communication with said first plate;
a second plate substantially parallel to and spaced apart from said first plate;
a fluid circulation network disposed between said first and second plates, said fluid circulation network comprising:

a plurality of tubes secured to said first plate so as to be in thermal communication with said first plate; and a pair of manifolds secured to said first and second plates and in fluidic communication with said plurality of tubes, one of said pairs of manifolds having a fluid inlet and the other of said pair of manifolds having a fluid outlet;

a honeycomb layer disposed between said first and second plates, said honeycomb layer extending between said first and second plates and between said pair of manifolds so as to structurally stiffen said panel, said honeycomb layer having cells which are oriented substantially perpendicular to said first and second plates, said honeycomb layer having grooves formed therein for receiving said plurality of tubes;

a plurality of fixing locations on said first plate for securing said equipment to said panel, said plurality of fixing locations defining an array of fixing locations between adjacent pairs of said plurality of tubes; and inserts occupying at least some of said plurality of fixing locations, said inserts extending through at least a portion of said panel so as to provide means for securing said equipment to said panel.

* * * * *

UNITED STATES PATENT AND TRADEMARK OFFICE
CERTIFICATE OF CORRECTION

PATENT NO. : 5,263,538
DATED : November 23, 1993
INVENTOR(S) : Marcel Amidieu and Jean-Loup Foret It is certified that error appears in the above-identified patent and that said Letters Patent is hereby corrected as shown below:

Column 1, line 18, delete "powered" insert ---- energetic ----.

Column 2, line 5, delete "support" insert ---- mechanical ----.

Column 5, line 66, delete "S" insert ---- 5 ----.

Column 6, line 6, delete "11'" insert ---- 11'' ----.

Column 8, line 7, delete "contacts" insert ---- contact ----.

Column 8, line 49, delete "in" insert ---- an ----.

Column 9, line 6, delete "pairs" insert ---- pair ----.

Signed and Sealed this

Seventh Day of June, 1994

Attest:

BRUCE LEHMAN

*Attesting Officer*  *Commissioner of Patents and Trademarks*